(12) United States Patent
Kamath et al.

(10) Patent No.: US 12,250,789 B2
(45) Date of Patent: Mar. 11, 2025

(54) COOLING SYSTEMS HAVING COOLING AND AUGMENTATION LOOPS FOR ELECTRONIC COMPONENTS AND RELATED METHODS

(71) Applicant: Lenovo Enterprise Solutions (Singapore) Pte Ltd., Singapore (SG)

(72) Inventors: Vinod Kamath, Morrisville, NC (US); Jeffrey S Holland, Morrisville, NC (US); Arvind Modekeurti, Morrisville, NC (US)

(73) Assignee: Lenovo Global Technology (United States) Inc., Morrisville, NC (US)

( * ) Notice: Subject to any disclaimer, the term of this patent is extended or adjusted under 35 U.S.C. 154(b) by 349 days.

(21) Appl. No.: 17/957,213

(22) Filed: Sep. 30, 2022

(65) Prior Publication Data
US 2024/0114652 A1 Apr. 4, 2024

(51) Int. Cl.
| | |
|---|---|
| G06F 1/16 | (2006.01) |
| G06F 1/20 | (2006.01) |
| H05K 5/00 | (2006.01) |
| H05K 7/00 | (2006.01) |
| H05K 7/20 | (2006.01) |

(52) U.S. Cl.
CPC .......... H05K 7/20272 (2013.01); G06F 1/20 (2013.01); *G06F 2200/201* (2013.01)

(58) Field of Classification Search
CPC ............ G06F 1/20; G06F 1/203; G06F 1/206; H05K 7/20272; H05K 7/20281; H05K 7/20263; H05K 7/20254; H05K 7/20218
See application file for complete search history.

(56) References Cited

U.S. PATENT DOCUMENTS

| | | | | |
|---|---|---|---|---|
| 2007/0274043 A1* | 11/2007 | Shabany | ............ | H05K 7/20781 361/696 |
| 2012/0024501 A1* | 2/2012 | Campbell | .......... | H05K 7/20236 165/104.33 |
| 2015/0237767 A1* | 8/2015 | Shedd | ........ | F28F 3/12 165/104.31 |
| 2016/0118317 A1* | 4/2016 | Shedd | ........ | F28F 9/26 257/712 |
| 2017/0105313 A1* | 4/2017 | Shedd | ........ | H05K 7/20309 |
| 2022/0240421 A1* | 7/2022 | Zhang | ........ | H05K 7/20772 |
| 2024/0040746 A1* | 2/2024 | Zhang | ........ | H05K 7/20781 |
| 2024/0074104 A1* | 2/2024 | Chehade | ........ | H05K 7/20772 |

* cited by examiner

*Primary Examiner* — Anthony M Haughton
(74) *Attorney, Agent, or Firm* — Olive Law Group, PLLC

(57) ABSTRACT

Cooling systems having cooling and augmentation loops for electronic components and related methods are disclosed. According to an aspect, a cooling system for an electronic component includes a cooling loop in thermal transfer interface with a first electronic component. The cooling loop is configured to contain a first flow of a cooling liquid between an inlet and an outlet. The cooling system also includes at least one augmentation loop configured to contain a second flow of the cooling liquid and alternately engage and disengage with respect to the cooling loop, such that engaging the augmentation loop to the cooling loop converts a series flow pattern with the first flow of the cooling liquid into a parallel flow pattern of a portion of the first flow of the cooling liquid with the second flow of the cooling liquid, without disconnection of the cooling loop from the inlet and outlet.

20 Claims, 2 Drawing Sheets

COOLING SYSTEMS HAVING COOLING AND AUGMENTATION LOOPS FOR ELECTRONIC COMPONENTS AND RELATED METHODS

TECHNICAL FIELD

The presently disclosed subject matter relates generally to cooling systems for electronic components. Particularly, the presently disclosed subject matter relates to cooling systems having cooling and augmentation loops for electronic components and related methods.

BACKGROUND

Computing devices typically require cooling systems in order to maintain optimal performance and extend their time of usage. Often computing devices are cooled by fan or ambient air, but sometimes more effective cooling is needed, particularly with servers. Servers and their electronic components can run for extended times such that high temperatures can be reached without adequate cooling.

For servers, liquid cooling systems are often used. These cooling systems often use cooling loops or conduits that carry cooling liquid in proximity to electronic components that need cooling. A conduit can transfer heat away from an electronic component to thereby cool the component.

Cooling loops are mechanical components and therefore cannot easily be dynamically configured without significant difficulty. For at least this reason, there is a need for liquid cooling system that can be easily configured depending on system requirements.

BRIEF DESCRIPTION OF THE DRAWINGS

Figure 1:
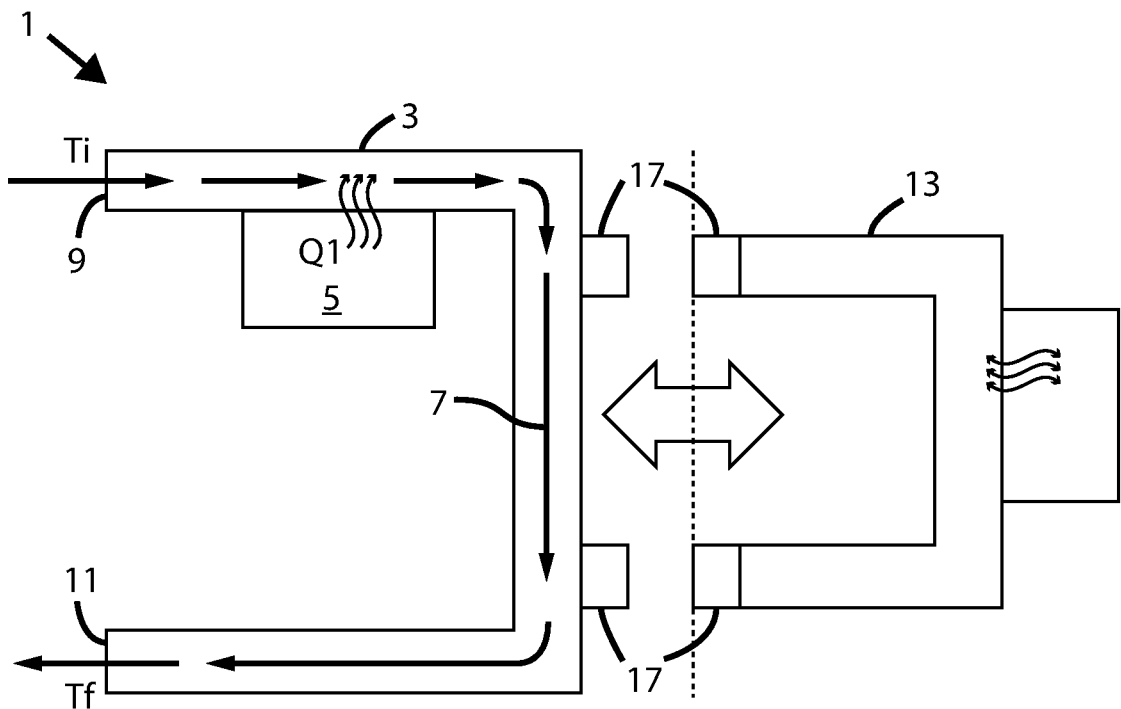
Figure 2:
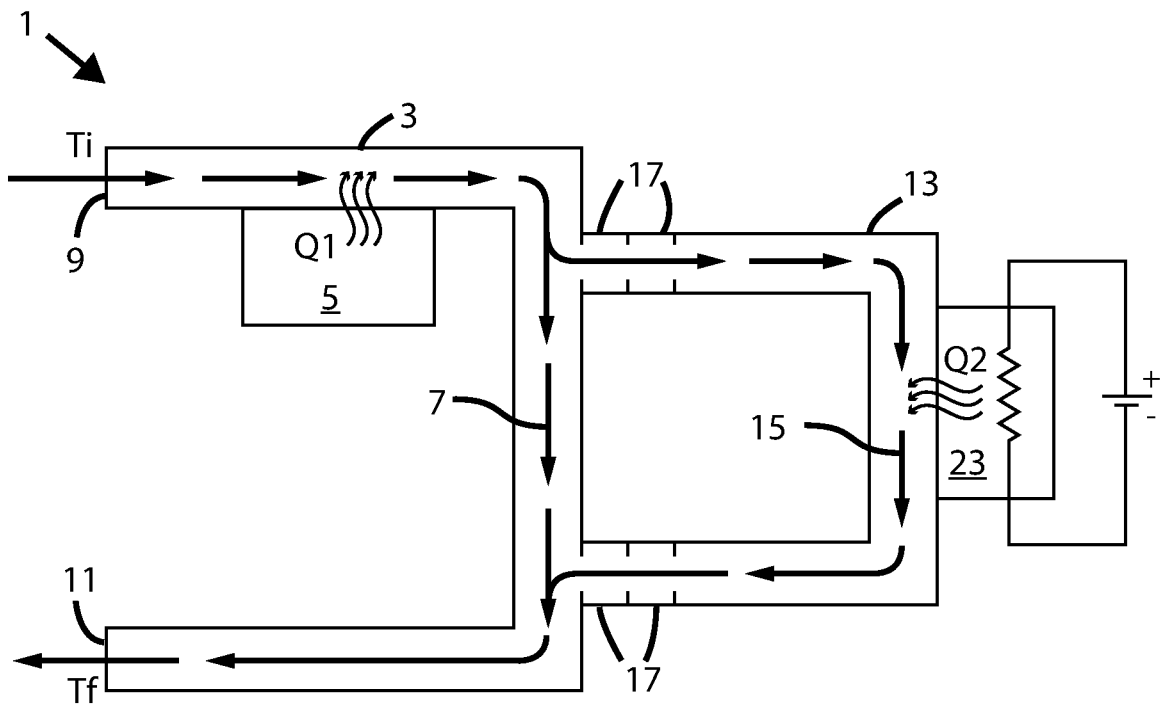
Figure 3:
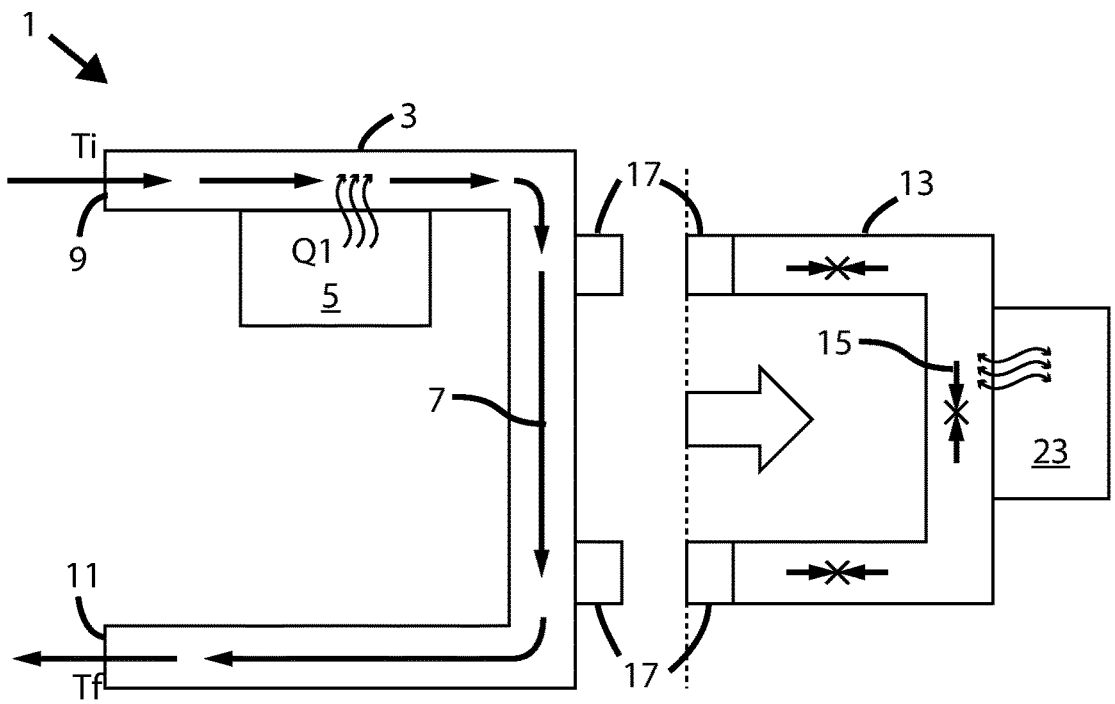
Figure 4:
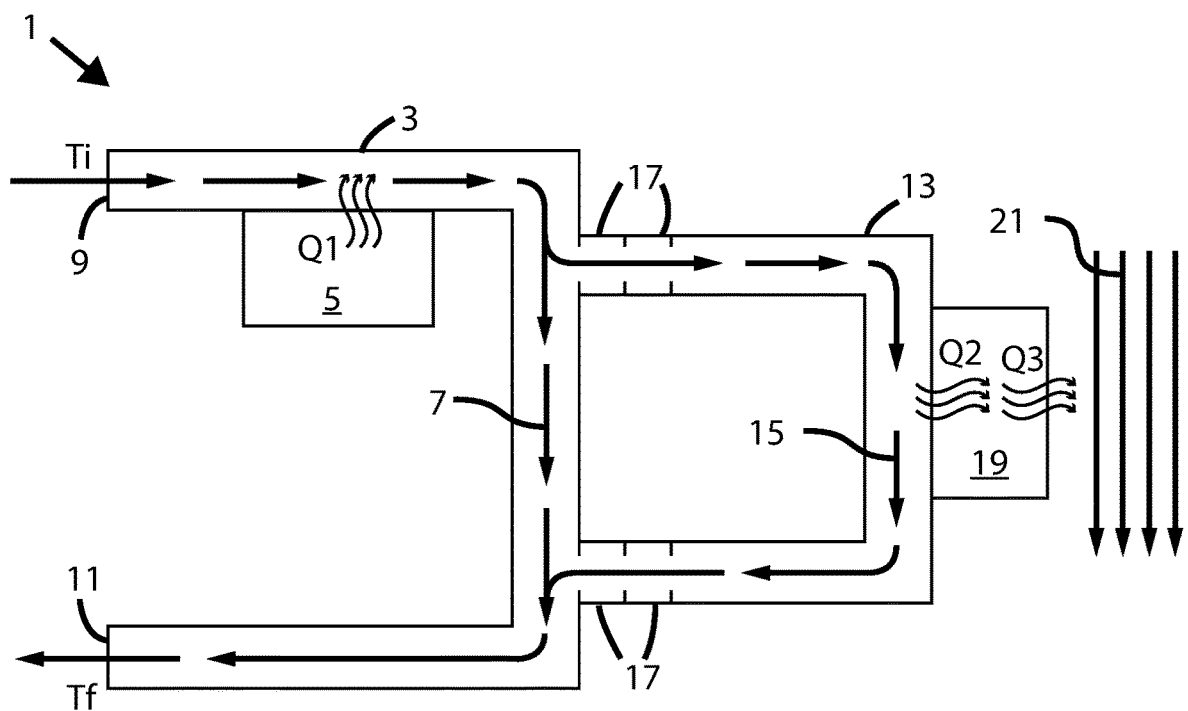

Having thus described the presently disclosed subject matter in general terms, reference will be made to the accompanying Drawings, which are not necessarily drawn to scale, and wherein:

FIG. 1 is a diagram of a cooling system comprising a cooling loop for an electronic component and an augmentation loop, disengaged, with respect to the cooling loop;

FIG. 2 is a diagram of a cooling system comprising a cooling loop for an electronic component and an augmentation loop engaged to the cooling loop, providing a first flow of a cooling liquid and a second flow of a cooling liquid in a parallel pattern, cooling a first electronic component and a second electronic component;

FIG. 3 is a diagram of a cooling system comprising a cooling loop for an electronic component and an augmentation loop sealingly disengaged with respect to the cooling loop; and FIG. 4 is a diagram of a cooling system comprising a cooling loop for an electronic component and an augmentation loop engaged to the cooling loop, providing a first flow of a cooling liquid and a second flow of a cooling liquid in a parallel pattern, cooling a first electronic component and transferring heat to a fluid separated from the cooling liquid.

SUMMARY

The presently disclosed subject matter is directed to cooling systems having cooling and augmentation loops for electronic components and related methods. According to an aspect, a cooling system for an electronic component includes a cooling loop in thermal transfer interface with a first electronic component. The cooling loop is configured to contain a first flow of a cooling liquid between an inlet and an outlet. The cooling system also includes at least one augmentation loop configured to contain a second flow of the cooling liquid and alternately engage and disengage with respect to the cooling loop, such that engaging the augmentation loop to the cooling loop converts a series flow pattern with the first flow of the cooling liquid into a parallel flow pattern of a portion of the first flow of the cooling liquid with the second flow of the cooling liquid, without disconnection of the cooling loop from the inlet and outlet.

According to another aspect, a cooling system for an electronic component includes a cooling loop in thermal transfer interface with a first electronic component. The cooling loop is configured to contain a first flow of a cooling liquid between an inlet and an outlet. The cooling system includes a first connector at a first point along the cooling loop. Further, the cooling system includes a second connector at a second point along the cooling loop. The first and second connectors are configured to alternately connect to and disconnect from an augmentation loop configured to contain a second flow of the cooling liquid without disconnection of the cooling loop from the inlet and outlet, such that connecting the augmentation loop to the cooling loop converts a series flow pattern with the first flow of the cooling liquid into a parallel flow pattern between the first and second points along the cooling loop of a portion of the first flow of the cooling liquid with the second flow of the cooling liquid.

According to another aspect, a method for cooling an electronic component comprises providing a cooling system that includes a cooling loop in thermal transfer interface with a first electronic component and configured to contain a first flow of a cooling liquid between an inlet and an outlet. The cooling system further includes a first connector at a first point along the cooling loop. The cooling system also includes a second connector at a second point along the cooling loop. The method also includes connecting the first and second connectors to an augmentation loop. The augmentation loop is configured to contain a second flow of the cooling liquid without disconnection of the cooling loop from the inlet and outlet, such that connecting the augmentation loop to the cooling loop converts a series flow pattern with the first flow of the cooling liquid into a parallel flow pattern between the first and second points along the cooling loop of a portion of the first flow of the cooling liquid with the second flow of the cooling liquid.

DETAILED DESCRIPTION

The following detailed description is made with reference to the figures. Exemplary embodiments are described to illustrate the disclosure, not to limit its scope, which is defined by the claims. Those of ordinary skill in the art will recognize a number of equivalent variations in the description that follows.

Articles "a" and "an" are used herein to refer to one or to more than one (i.e. at least one) of the grammatical object of the article. By way of example, "an element" means at least one element and can include more than one element.

"About" is used to provide flexibility to a numerical endpoint by providing that a given value may be "slightly above" or "slightly below" the endpoint without affecting the desired result.

The use herein of the terms "including," "comprising," or "having," and variations thereof is meant to encompass the elements listed thereafter and equivalents thereof as well as additional elements. Embodiments recited as "including,"

"comprising," or "having" certain elements are also contemplated as "consisting essentially of" and "consisting" of those certain elements.

Recitation of ranges of values herein are merely intended to serve as a shorthand method of referring individually to each separate value falling within the range, unless otherwise indicated herein, and each separate value is incorporated into the specification as if it were individually recited herein. For example, if a range is stated as between 1%-50%, it is intended that values such as between 2%-40%, 10%-30%, or 1%-3%, etc. are expressly enumerated in this specification. These are only examples of what is specifically intended, and all possible combinations of numerical values between and including the lowest value and the highest value enumerated are to be considered to be expressly stated in this disclosure.

Unless otherwise defined, all technical terms used herein have the same meaning as commonly understood by one of ordinary skill in the art to which this disclosure belongs.

FIGS. 1-4 illustrate example cooling systems 1 for an electronic component 5 in accordance with embodiments of the present disclosure. The cooling system includes a cooling loop 3 in thermal transfer interface with a first electronic component 5 and containing a first flow 7 of a cooling liquid between an inlet 9 and an outlet 11. Further, there is shown an augmentation loop 13 configured to contain a second flow 15 of the cooling liquid. The augmentation loop 13 is configured to alternately engage and disengage with respect to the cooling loop 3, such that engaging the augmentation loop 13 to the cooling loop 3 converts the flow pattern of cooling liquid through the cooling system 1 from a series flow pattern (FIGS. 1 and 3) to a parallel flow pattern (FIGS. 2 and 4).

Further, contemplated embodiments are configured to convert the flow pattern of the cooling system 1 from a series flow pattern (FIG. 1) with the first flow 7 of the cooling liquid cooling a first electronic component 5 into a parallel flow pattern of the cooling liquid with the first flow 7 of the cooling liquid and second flow 15 of the cooling liquid cooling at least a first electronic component 5 and cooling at least a second electronic component (23, FIG. 2) or being cooled by a heat exchanger (19, FIG. 4), without disconnection of the cooling loop 3 from the inlet 9 and outlet 11.

In all of FIGS. 1-4, the exemplary embodiments of cooling systems 1 comprise quick disconnect connectors 17 on the cooling loop 3 and augmentation loop 13, but should be considered non-limiting upon methods and devices for the augmentation loop 13 to alternately engage and disengage with respect to the cooling loop 3.

FIG. 1 shows a cooling system 1 comprising a cooling loop 3 for an electronic component 5, and an augmentation loop 13, disengaged, with respect to the cooling loop 3. As the first flow 7 of cooling liquid passes through the cooling loop 3, a first amount of heat Q1 is transferred from the electronic component 5 to the first flow 7 of cooling liquid, such that the heat Q1 is carried out of the system 1 via outlet 11. A second electronic component 23 is in heat transfer interface with the augmentation loop 13, but is disengaged from the cooling loop 3, and there is no flow of the cooling liquid passing through the augmentation loop 13.

FIG. 2 shows a similar embodiment to the system 1 of FIG. 1, but here, a cooling system 1 comprises a cooling loop 3 for an electronic component 5 and an augmentation loop 13 that is engaged to the cooling loop 3, providing a first flow 7 of a cooling liquid and a second flow 15 of a cooling liquid in a parallel pattern, cooling a first electronic component 5 and a second electronic component 23.

Specifically, the augmentation loop 13 is in thermal transfer interface with a second electronic component 23, such that engaging the augmentation loop 13 to the cooling loop 3 cools the second electronic component 23 with the second flow 15 of cooling liquid in a parallel pattern, with respect to the first flow 7 of cooling liquid. As the first flow 7 of cooling liquid passes through the cooling loop 3, a first amount of heat Q1 is transferred from the electronic component 5 to the first flow 7 of cooling liquid. Then, via the quick disconnects 17, cooling liquid is diverted into the second flow 13, and a second amount of heat Q2 is transferred from the second electronic component 23 to the second flow 13 of cooling liquid. Thereby, heat Q1 and heat Q2 is carried out of the system 1 via outlet 11.

With such alternately engageable and disengageable systems 1 of FIGS. 1 and 2, respectively, the present invention contemplates solutions for cooling systems designed for longer lifetimes of use, with fewer replacements and shorter downtimes, for enduring the cooling load of a device initially specified to particular electronic burden, such as computing systems, which may change significantly over time. For a range of computing systems, any particular computing system may need to incorporate more heat-producing electronic components over time, or the form factor or scale or heat demands of some electronic components may change over time, or the computing system may face a reduced computing burden, relative to the originally estimated burden, and the heat production may decrease or simply be lower than expected. Therefore, for any of these scenarios, the solutions inherent in the cooling systems 1 of FIGS. 1 and 2 facilitate tailoring of a cooling system without necessitating complete replacement of the systems 1.

A comparison of FIGS. 1 and 2 demonstrates how the cooling systems 1 facilitate multiple cooling burden arrangements with a single flow rate, for a system with increased quantities of heat and increased quantities of heat-producing electronic components. Comparing FIG. 1 to FIG. 2, where the electronic component 5 produces the same amount of heat, the flow rate at the inlet is the same, the cooling liquid has the same heat capacity, the temperature of the cooling liquid entering the inlet 9 is Ti, and the temperature of the cooling liquid exiting the outlet 11 is Tf. In FIG. 1, where the electronic component 5 is the only heat-contributing component in thermal transfer interface with a flow of the cooling liquid, then the heat absorbed in is limited to Q1, and the difference between Tf and Ti is proportional to Q1. In FIG. 2, where the electronic component 5 and the second electronic component 23 are both in thermal transfer interface with the cooling liquid (both the first flow 7 and the second flow 15), then both the heat Q1 from the first electronic component 5 and the heat Q2 from the second electronic component 23 are absorbed by the cooling liquid, and the difference between Tf and Ti is proportional to the sum of Q1 and Q2.

FIG. 3 shows a similar embodiment to the cooling system 1 of FIG. 2, but here, a cooling system 1 comprising a cooling loop 3 for a first electronic component 5 and an augmentation loop 13 is shown with the augmentation loop 13 sealingly disengaged, with respect to the cooling loop 3. Specifically, for this cooling system 1, the augmentation loop 13 is configured to sealingly disengage from the cooling loop 3 by being physically grasped and moved away (indicated by the large arrow) from the cooling loop 3 and/or spatially translated away from the cooling loop 3. Further, the augmentation loop 13 is configured to sealingly disengage from the cooling loop 3 by interrupting the second flow (15, FIG. 2) of cooling liquid and without interrupting the first flow 7 of the cooling liquid.

As mentioned above, the augmentation loop 13 is configured to be sealingly disengaged from the cooling loop 3 with the quick disconnects 17. As such, removal of the augmentation loop 13 seals the augmentation loop 13 against leakage, and arrests the second flow 15 of cooling liquid within the augmentation loop 13.

For any particular computing system, some electronic components may become obsolete or unnecessary. For example, where many computing systems once required disk drives or removable media for updates, some became updateable with remotely-accessible programming or networked communications. For such computing systems, the previous hardware for installing such data would be obsolete, and retaining the hardware would amount to cooling unnecessary devices. With computing systems requiring complete replacement of a cooling system, just to remove auxiliary components, the waste of the excess heat consumed would have to be balanced against the cost of the entirely new cooling hardware and the large maintenance efforts and time-costs of shutting down. By comparison, for the cooling system 1 of FIG. 3, removing components in the manner similar to the removal of the augmentation loop 13 of FIG. 3 would allow for the prospect of updating hardware by removing the undesired components without interrupting the cooling loop 3 or the first flow 7 of the cooling liquid or affecting the first electronic component 5.

FIG. 4 shows a similar embodiment to the cooling system 1 of FIG. 2, the instant cooling system 1 comprising a cooling loop 3 for an electronic component 5 and an augmentation loop 13 engaged to the cooling loop 3, providing a first flow 7 of a cooling liquid and a second flow 15 of a cooling liquid in a parallel pattern, the first flow 7 cooling a first electronic component 5. Here, however, the augmentation loop 13 comprises a fluid-to-liquid heat exchanger 19 in thermal transfer interface (Q2) with the augmentation loop 13 that is configured to transfer heat (Q3) between the second flow 15 of cooling liquid and a fluid 21, where the fluid 21 is separated from the cooling liquid. Here, the fluid 21 comprises a flow of air ambient to the system 1, passing by the fluid-to-liquid heat exchanger 19, such that its movement passing the fluid-to-liquid heat exchanger 19 arranges it in a convective heat transfer interface with the heat exchanger 19, represented by the arrows indicating a heat flow Q3 from the fluid-to-liquid heat exchanger 19. In some embodiments the fluid 21 may be a volume of air or gaseous mixture proximate to the heat exchanger 19. Other gases, gaseous mixtures, and other fluids, other than air, are also contemplated, in other embodiments.

For a range of computing systems, any particular computing system may produce more heat from the same electronic components over time, or the computing system may face a higher computing burden, relative to the originally estimated burden, and the heat production may increase or simply be higher than expected. Therefore, for any of these scenarios, the solutions inherent in the cooling systems 1 of FIGS. 1 and 4 facilitate tailoring of a cooling system without necessitating complete replacement of the systems A comparison of FIGS. 1 and 4 demonstrates how the cooling systems 1 facilitate multiple cooling burden arrangements with a single flow rate, for a system with a stable heat production but increased quantities of heat. Comparing FIG. 1 to FIG. 4, where the electronic component 5 produces the same amount of heat, the flow rate at the inlet is the same, the cooling liquid has the same heat capacity, the temperature of the cooling liquid entering the inlet 9 is Ti, and the temperature of the cooling liquid exiting the outlet 11 is Tf. In FIG. 1, where the electronic component 5 is the only heat-contributing component in thermal transfer interface with a flow of the cooling liquid, then the heat absorbed is intended to accommodate the estimated amount of heat Q1, and the designed difference between Tf and Ti is intended to be proportional to Q1. In FIG. 4, where the electronic component 5 and the fluid-to-liquid heat exchanger 19 are both in thermal transfer interface with the cooling liquid (both the first flow 7 and the second flow 15), then while the first flow of cooling liquid 7 may absorb Q1 in an amount that would result in a Tf that is higher than desired, the fluid-to-liquid heat exchanger 19 can remove an amount of heat Q2 from the second flow of cooling liquid 13, to the approximate amount of heat Q3 that can be contributed to the fluid 21. Therefore, the difference between Tf and Ti can be brought to a desired amount, proportional to the heat Q1 from the first electronic component 5, reduced by the heat Q2 removed from the second flow of cooling liquid 13 by the fluid-to-liquid heat exchanger 19.

While the embodiments have been described in connection with the various embodiments of the various figures, it is to be understood that other similar embodiments may be used, or modifications and additions may be made to the described embodiment for performing the same function without deviating therefrom. Therefore, the disclosed embodiments should not be limited to any single embodiment, but rather should be construed in breadth and scope in accordance with the appended claims.

What is claimed is:

1. A cooling system for an electronic component, the cooling system comprising:
   a cooling loop in thermal transfer interface with a first electronic component and configured to contain a first flow of a cooling liquid between an inlet and an outlet; and
   at least one augmentation loop configured to contain a second flow of the cooling liquid and alternately engage and disengage with respect to the cooling loop, such that engaging the augmentation loop to the cooling loop converts a series flow pattern with the first flow of the cooling liquid into a parallel flow pattern of a portion of the first flow of the cooling liquid with the second flow of the cooling liquid, without disconnection of the cooling loop from the inlet and outlet.

2. The cooling system of claim 1, wherein the at least one augmentation loop is configured to sealingly disengage from the cooling loop by being physically moved away from the cooling loop.

3. The cooling system of claim 1, wherein the at least one augmentation loop is configured to sealingly disengage from the cooling loop by interrupting the second flow of cooling liquid without interrupting the first flow of the cooling liquid.

4. The cooling system of claim 1, wherein the at least one augmentation loop is configured to be sealingly disengaged from the cooling loop with quick disconnect connectors.

5. The cooling system of claim 1, wherein the cooling loop comprises quick disconnect connectors and is configured to be alternately sealingly engaged-to and sealingly disengaged-from the at least one augmentation loop by the quick disconnect connectors.

6. The cooling system of claim 1, further comprising a heat exchanger in thermal transfer interface with the at least one augmentation loop and configured to transfer heat between a fluid separated from the second flow of liquid and the second flow of liquid.

7. The system of claim 6, wherein the fluid comprises air or an ambient gaseous mixture.

8. The system of claim 6, wherein the heat exchanger is configured to transfer heat from the second flow of cooling liquid to the fluid.

9. The system of claim 8, wherein the heat exchanger is configured to, when the at least one augmentation loop is engaged to the cooling loop, cool the second flow of cooling liquid in parallel without cooling the parallel portion of the first flow of cooling liquid.

10. The system of claim 1, wherein the at least one augmentation loop is in thermal transfer interface with a second electronic component, and configured to cool the second electronic component with the second flow of cooling liquid.

11. A cooling system for an electronic component, the cooling system comprising:
a cooling loop in thermal transfer interface with a first electronic component and configured to contain a first flow of a cooling liquid between an inlet and an outlet;
a first connector at a first point along the cooling loop; and
a second connector at a second point along the cooling loop,
wherein the first and second connectors are configured to alternately connect to and disconnect from an augmentation loop configured to contain a second flow of the cooling liquid without disconnection of the cooling loop from the inlet and outlet, such that connecting the augmentation loop to the cooling loop converts a series flow pattern with the first flow of the cooling liquid into a parallel flow pattern between the first and second points along the cooling loop of a portion of the first flow of the cooling liquid with the second flow of the cooling liquid.

12. The cooling system of claim 11, wherein the augmentation loop is configured to sealingly disengage from the cooling loop by being physically moved away from the cooling loop.

13. The cooling system of claim 11, wherein the augmentation loop is configured to sealingly disengage from the cooling loop by interrupting the second flow of cooling liquid without interrupting the first flow of the cooling liquid.

14. The cooling system of claim 11, wherein the augmentation loop is configured to be sealingly disengaged from the cooling loop with quick disconnect connectors.

15. The cooling system of claim 11, wherein the cooling loop comprises quick disconnect connectors and is configured to be alternately sealingly engaged-to and sealingly disengaged-from the augmentation loop by the quick disconnect connectors.

16. The cooling system of claim 11, further comprising a heat exchanger in thermal transfer interface with the augmentation loop and configured to transfer heat between a fluid separated from the second flow of liquid and the second flow of liquid.

17. The system of claim 16, wherein the fluid comprises air or an ambient gaseous mixture.

18. The system of claim 16, wherein the heat exchanger is configured to transfer heat from the second flow of cooling liquid to the fluid.

19. The system of claim 18, wherein the heat exchanger is configured to, when the augmentation loop is engaged to the cooling loop, cool the second flow of cooling liquid in parallel without cooling the parallel portion of the first flow of cooling liquid.

20. A method for cooling an electronic component, the method comprising:
providing a cooling system comprising a cooling loop in thermal transfer interface with a first electronic component and configured to contain a first flow of a cooling liquid between an inlet and an outlet, wherein the cooling system further comprises a first connector at a first point along the cooling loop, and wherein the cooling system further comprises a second connector at a second point along the cooling loop; and
connecting the first and second connectors to an augmentation loop configured to contain a second flow of the cooling liquid without disconnection of the cooling loop from the inlet and outlet, such that connecting the augmentation loop to the cooling loop converts a series flow pattern with the first flow of the cooling liquid into a parallel flow pattern between the first and second points along the cooling loop of a portion of the first flow of the cooling liquid with the second flow of the cooling liquid.

* * * * *